(12) United States Patent
Bose et al.

(10) Patent No.: US 7,166,372 B2
(45) Date of Patent: Jan. 23, 2007

(54) THERMAL BARRIER COATING UTILIZING A DISPERSION STRENGTHENED METALLIC BOND COAT

(75) Inventors: Sudhangshu Bose, Manchester, CT (US); Daniel A. Bales, Avon, CT (US); Mark T. Ucasz, Middletown, CT (US); Merritt W. Wight, East Hartford, CT (US); Steven M. Burns, West Hartford, CT (US); Tyrus E. Royal, Wethersfield, CT (US)

(73) Assignee: United Technologies Corporation, Hartford, CT (US)

( * ) Notice: Subject to any disclaimer, the term of this patent is extended or adjusted under 35 U.S.C. 154(b) by 0 days.

(21) Appl. No.: 10/922,009

(22) Filed: Aug. 19, 2004

(65) Prior Publication Data
US 2005/0053799 A1 Mar. 10, 2005

Related U.S. Application Data

(63) Continuation of application No. 10/212,928, filed on Aug. 5, 2002, now Pat. No. 6,833,203.

(51) Int. Cl.
*F03B 3/12* (2006.01)
*B32B 15/04* (2006.01)

(52) U.S. Cl. ............... 428/698; 428/323; 428/325; 428/610; 428/621; 428/627; 428/632; 416/241 R; 416/241 B

(58) Field of Classification Search ........... 428/621, 428/632, 633, 630, 650, 655, 668, 323, 328, 428/329, 332, 629, 698, 699, 701, 702; 416/241 B, 416/241 R
See application file for complete search history.

(56) References Cited

U.S. PATENT DOCUMENTS 5,078,837 A * 1/1992 Descamp et al. ........... 205/181
5,955,151 A 9/1999 Hajmrle et al.
6,129,988 A 10/2000 Vance et al.

FOREIGN PATENT DOCUMENTS

EP 0 552 004 A1 7/1993
GB 1439947 6/1976

OTHER PUBLICATIONS

Patent Abstracts of Japan, vol. 1998, No. 12, Oct. 31, 1998, JP 10 195547 A (Nippon Steel Corp.), Jul. 28, 1998.

* cited by examiner

*Primary Examiner*—Jennifer C. McNeil
*Assistant Examiner*—Aaron Austin
(74) *Attorney, Agent, or Firm*—Bachman & LaPointe

(57) ABSTRACT

The present invention relates to an overlay coating which has improved strength properties. The overlay coating comprises a deposited layer of MCrAlY material containing discrete nitride particles therein. The nitride particles are present in a volume fraction in the range of 0.1% to 15.0% and have a particle size in the range of from 0.1 microns to 10.0 microns. The coating may also have oxide particles dispersed therein.

5 Claims, 2 Drawing Sheets

THERMAL BARRIER COATING UTILIZING A DISPERSION STRENGTHENED METALLIC BOND COAT

CROSS REFERENCE TO RELATED APPLICATION(S)

This application is a continuation application of U.S. patent application Ser. No. 10/212,928, filed Aug. 5, 2002 now U.S. Pat. No. 6,833,203, entitled THERMAL BARRIER COATING UTILIZING A DISPERSION STRENGTHENED METALLIC BOND COAT, by Sudhangshu Bose et al.

BACKGROUND OF THE INVENTION

The present invention relates to improved overlay or bond coatings applied to materials used in the hot sections of modern gas turbine engines.

Thermal barrier coatings on a substrate alloy usually include a thermally insulating ceramic layer deposited over a metallic bond coat. Traditionally, thermal barrier coatings use yttria partially stabilized zirconia on a bond coat such as MCrAlY delivered by a low pressure plasma spray, air plasma, or physical vapor deposition method. A typical thermal barrier coating for a rotating airfoil application consists of the metallic bond coat over a single crystal casting of a nickel based alloy. On the bond coat, the thermally insulating layer is deposited typically by electron beam physical vapor deposition. The ceramic adheres to the bond coat through the formation of a thin, thermally grown oxide scale of aluminum oxide. During engine operation, the thermally grown oxide grows. Attendant with the growth of the oxide scale are increased thermally grown oxide residual stresses and bond coat creep.

Thus, there is needed an overlay bond coat which has improved strength, particularly creep strength, and which would lead to improved thermal barrier coating life.

SUMMARY OF THE INVENTION

Accordingly, it is an object of the present invention to provide a bond coating which has improved strength properties.

It is a further object of the present invention to provide a method for forming an improved overlay bond coating having improved strength properties.

The foregoing objects are attained by the overlay coatings and the deposition method of the present invention.

In accordance with the present invention, an improved overlay coating is provided. The overlay coating comprises a deposited layer of MCrAlY material containing discrete nitride particles therein. The overlay coatings of the present invention may also include dispersed oxide particles as well as dispersed nitride particles.

A method for forming an overlay coating on a substrate material, such as a component used in a hot section of a gas turbine engine, broadly comprises depositing a MCrAlY coating on a substrate material and forming a plurality of discrete nitride particles in the coating. The nitride particles are preferably formed using a controlled introduction of nitrogen during the deposition step. After the overlay or bond coating with the dispersion particles have been formed, a thermal barrier coating may be formed over the overlay or bond coating.

Other details of the thermal barrier coating through the application of dispersion strengthened metallic bond, as well as other objects and advantages attendant thereto, are set forth in the following detailed description.

DETAILED DESCRIPTION OF THE PREFERRED EMBODIMENT(S)

Figure 1A:
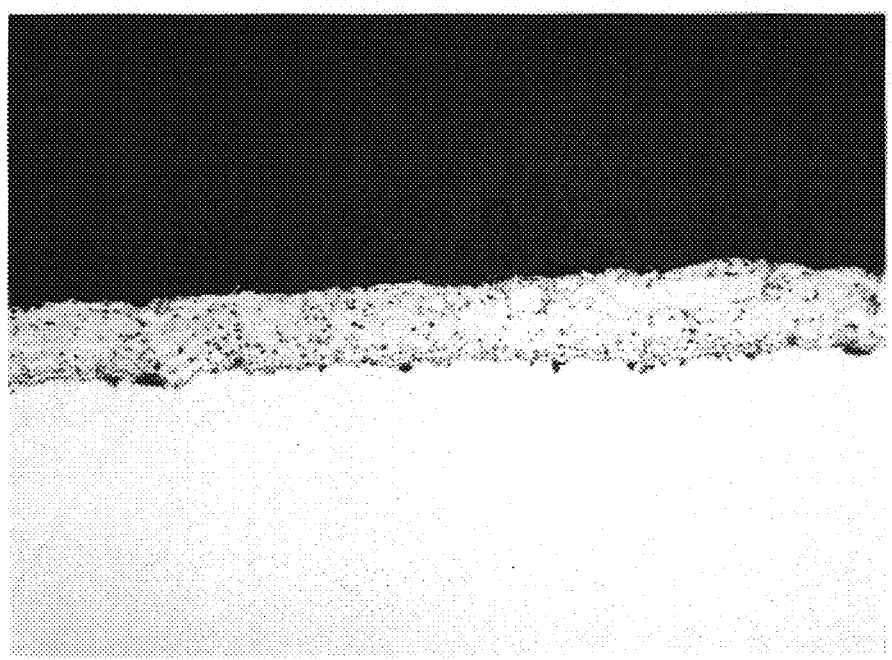
FIG. 1A is a photomicrograph of the cross section of a thermal barrier coated blade having a bond coat with a fine dispersion of aluminum nitride.

The present invention is directed to providing an improved overlay or bond coating of the MCrAlY type family of overlay coatings which is particularly useful when applied to components, such as blades and vanes, used in the hot section (turbine and combustor sections) of modern gas turbine engines. The overlay or bond coatings of the present invention have improved strength properties, particularly creep strength, through the incorporation of a dispersion of particles in the overlay or bond coatings. The particles may be nitride particles or a combination of nitride and oxide particles.

In accordance with the present invention, an overlay or bond coating having a desirable set of strength properties is formed by providing a substrate material, depositing a layer of MCrAlY type coating material on the substrate material, and forming a plurality of discrete nitride particles in the coating. The coatings of the present invention may be applied to any substrate alloy used to form components used in the hot section (turbine and combustor sections) of a modern gas turbine engine, such as single crystal nickel- or cobalt-based alloys. The overlay coating material to be deposited may be comprised of any suitable MCrAlY coating where M is selected from the group consisting of nickel, cobalt, iron, and mixtures thereof. A particularly useful MCrAlY type coating to be deposited on the substrate material used for a gas turbine engine component is a NiCoCrAlY coating. An illustrative NiCoCrAlY coating which may be applied has a composition comprising from 20 to 24 wt % cobalt, from 15 to 19 wt % chromium, from 0.10 to 15 wt % aluminum, from 0.1 to 0.4 wt % hafnium, from 0.4 to 1.25 wt % yttrium, and the balance nickel.

The MCrAlY coating may be deposited using either a physical vapor deposition process or a low pressure plasma spray process. When a physical vapor deposition process such as cathodic arc is used, the process is carried out in a chamber containing the substrate material and the materials to be deposited at a temperature greater than ambient (68° F.), preferably 300 degrees Fahrenheit to 1000 degrees Fahrenheit, for a time greater than 2 minutes, preferably in the range of 30 minutes to 60 minutes, at a pressure greater than 0.005 Torr, preferably from 0.01 to 0.02 Torr. The process may be carried out in an argon containing atmosphere such as a pure argon atmosphere or an argon and helium atmosphere. When a low pressure plasma spray process is used, the substrate and the materials used to form the coating are again placed in a chamber and the process is carried out at a temperature preferably in the range of 1600 to 1900 degrees Fahrenheit for a time on the order of 5 minutes at a pressure typically in the range of 30 to 40 Torr vacuum.

In order to strengthen the MCrAlY coating, a plurality of discrete nitride particles are incorporated into the coating. The nitride particles are preferably formed by introducing nitrogen into the chamber. For a chamber having a volume of 350 liters, nitrogen may be introduced at a flow rate greater than 2 microns per hour, preferably 5.0 to 100 microns per hour. The nitride particles formed in this manner during the coating operation are present in a volume fraction from greater than 0.1 to 15.0%, preferably from greater than 0.5 to 15.0%, and have a size in the range of from 0.1 to 10.0 microns, preferably from 0.3 to 0.5 microns. The nitride particles are typically uniformly dispersed throughout the coating but can be tailored to have gradient or other application specific microstructure.

If desired, the MCrAlY coating may be strengthened by incorporating oxide particles as well as nitride particles into the coating. The combination of nitride and oxide particles may be formed by introducing a gas containing oxygen and nitrogen, such as air, from the chamber. When nitride and oxide particles are formed, they are typically uniformly dispersed throughout the coating, but can be tailored to have a gradient or other application specific microstructure. The nitride and oxide particles each typically have a size in the range of from 0.1 to 10.0 microns, preferably from 0.3 to 0.5 microns. The nitride and oxide particles are present in a volume fraction from greater than 0.1 to 15.0%, preferably from greater than 0.5 to 15.0%.

Once the overlay coat has been deposited, the coating may be surface finished or peened to smooth the overlay bond coating. The overlay bond coating is more than 90% dense as deposited. Any suitable means known in the art may be used to perform the surface finishing or peening step. Prior to surface finishing or peening, the coating with the dispersed nitride particles or the dispersed nitride and oxide particles may be subjected to a heat treatment at a temperature of 1900 degrees Fahrenheit to 2100 degrees Fahrenheit for a time in the range of 1 to 4 hours.

After the overlay coating is formed, a ceramic thermal barrier coating may be deposited over the overlay coating. The ceramic thermal barrier coating may be any suitable thermal barrier coating known in the art and may be deposited using any suitable technique known in the art.

It should be noted that the dispersions of the present invention could be achieved through mechanical or chemical means as well as the techniques described above.

The following example was performed to demonstrate the invention described herein. Several first stage high pressure turbine blades were coated with a traditional bond coat as well as a dispersion strengthened bond coat formed using a cathodic arc process. The turbine blades were formed from a nickel based alloy having a composition containing 5.0 wt % chromium, 10 wt % cobalt, 5.65 wt % aluminum, 1.9 wt % molybdenum, 5.9 wt % tungsten, 0.10 wt % hafnium, 8.7 wt % tantalum, and 3.0 wt % rhenium, and the balance nickel. A coating was applied having a composition containing 15–19 wt % Cr, 20–24 wt % Co, 11.8–13.2 wt % Al, 0.1–0.4 wt % Hf, 0.4–0.8 wt % Y, and 0.2–0.6 wt % Si. The coating process was carried out in a chamber at a temperature below 1000 degrees Fahrenheit for 65 minutes at a pressure of 0.01 to 0.02 Torr. During the bond coat process, air was introduced at a rate greater than 2.0 microns per hour for a chamber having a volume of 350 liters. After the process for forming the coating with the dispersed nitride particles was completed, the blades were surface finished and a ceramic thermally insulating layer was formed over the bond coating. This layer was deposited by Electron Beam Physical Vapor Deposition. The coating was a 7 wt % yttria partially stabilized zirconia coating.

Figure 1B:
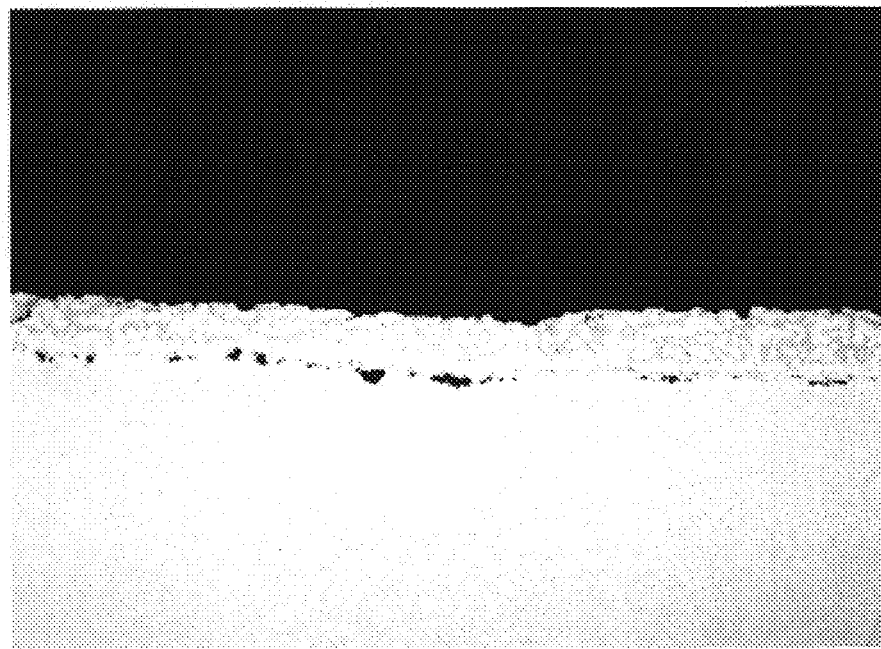
FIG. 1B is a photomicrograph of the cross section of a thermal barrier coated blade having a bond coat without a fine dispersion of aluminum nitride.
Figure 2:
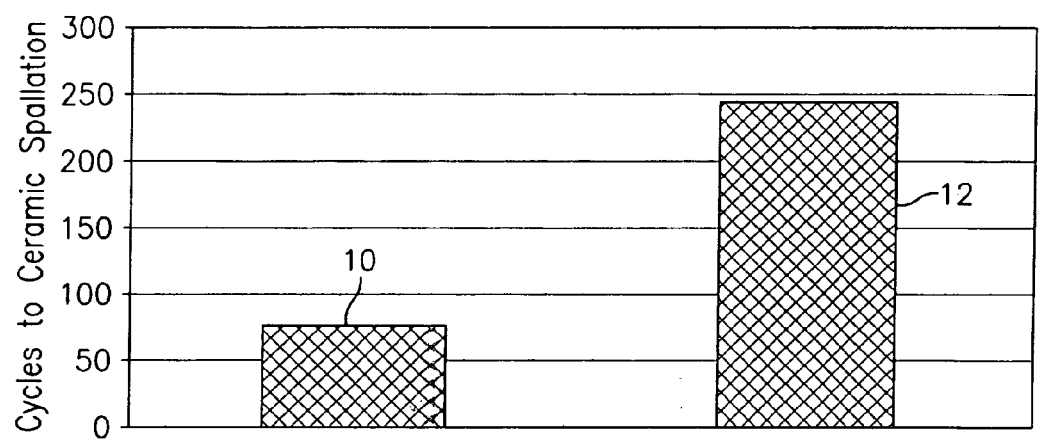
FIG. 2 is a graph showing a thermal barrier coating spall life in cycles.

The microstructure of the coated blades with the dispersion strengthened bond coat produced by the method described above is shown in FIG. 1A and may be compared with a baseline without the dispersion in the bond coat shown in FIG. 1B. Analysis of the composition of the bond coat shows that the dispersions are predominantly aluminum nitride. Hardness measurements indicated that indeed strengthening has occurred. The coated blades were subjected to cyclic burner rig testing to simulate engine exposure. The results of the cyclic burner rig testing (6 minutes in flame, 3 minutes forced air cool) done with maximum metal temperature of 2100 degrees Fahrenheit show that the thermal barrier coating with the dispersion bond coating has a spall life improvement of about 3.6× over that without the dispersion. See FIG. 2 where bar 10 shows the spall life of the thermal barrier coating with the non-dispersion bond coating and where bar 12 shows the spall life of the thermal barrier coating with the dispersion bond coating of the present invention.

It is apparent that there has been provided in accordance with the present invention a thermal barrier coating through the application of a dispersion strengthened metallic bond which fully satisfies the objects, means, and advantages set forth hereinbefore. While the present invention has been described in the context of specific embodiments thereof, other alternatives, modifications, and variations will become apparent to those skilled in the art having read the foregoing description. Accordingly, it is intended to embrace those alternatives, modifications, and variations that fall within the broad scope of the appended claims.

What is claimed is:

1. An overlay coating to be applied to a substrate material comprising a deposited MCrAlY overlay coating containing a plurality of discrete nitride particles, said nitride particles being present in a volume fraction in an amount in the range of greater than 0.1% to 15.0% and having a size in the range of from 0.1 microns to 10 microns, said nitride particles being dispersed throughout the coating to form a gradient microstructure.

2. The overlay coating according to claim 1, wherein said nitride particles have a size in the range of 0.3 microns to 10.0 microns.

3. An article comprising:
   a substrate material; and
   a MCrAlY coating deposited on the substrate material, said coating having a plurality of dispersed, discrete nitride particles therein, and said nitride particles being present in a volume fraction in an amount in the range of greater than 0.1% to 15% and having a size in the range of 0.1 microns to 10 microns, said nitride particles being dispersed throughout the coating to form a gradient microstructure.

4. An article according to claim 3, wherein said nitride particles are present in a volume fraction in an amount in the range of greater than 0.5% to 15.0%.

5. An article according to claim 3, wherein said nitride particles have a size in the range of 0.3 microns to 10.0 microns.

* * * * *